(12) United States Patent
Cheng et al.

(10) Patent No.: US 9,870,916 B2
(45) Date of Patent: Jan. 16, 2018

(54) LDMOS TRANSISTOR

(71) Applicant: Semiconductor Manufacturing International (Shanghai) Corporation, Shanghai (CN)

(72) Inventors: Yong Cheng, Shanghai (CN); Xianyong Pu, Shanghai (CN); Haiqiang Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/597,319

(22) Filed: May 17, 2017

(65) Prior Publication Data
US 2017/0250175 A1    Aug. 31, 2017

Related U.S. Application Data

(62) Division of application No. 14/808,026, filed on Jul. 24, 2015, now Pat. No. 9,691,604.

(30) Foreign Application Priority Data

Aug. 26, 2014  (CN) .......................... 2014 1 0425848

(51) Int. Cl.
*H01L 29/66*    (2006.01)
*H01L 21/02*    (2006.01)
(Continued)

(52) U.S. Cl.
CPC .. *H01L 21/02164* (2013.01); *H01L 21/76224* (2013.01); *H01L 21/76229* (2013.01);
(Continued)

(58) Field of Classification Search
CPC ........... H01L 21/02164; H01L 29/0847; H01L 29/7835; H01L 21/76224; H01L 29/66659;
(Continued)

(56) References Cited

U.S. PATENT DOCUMENTS 5,539,238 A * 7/1996 Malhi ................. H01L 29/0615
257/335
5,696,010 A * 12/1997 Malhi ................. H01L 29/0615
148/DIG. 126
(Continued)

*Primary Examiner* — Thanh Y Tran
(74) *Attorney, Agent, or Firm* — Anova Law Group, PLLC

(57) ABSTRACT

A LDMOS transistor includes a semiconductor substrate with a first doping type; a plurality of first trenches formed in the semiconductor substrate; a wave-shaped drift region with an increased conductive path and a second doping type formed on the semiconductor substrate between adjacent first trenches and the semiconductor substrate exposed by side and bottom surfaces of the first trenches; a first shallow trench isolation (STI) structure formed in each of the first trenches; a body region with the first doping type formed in semiconductor substrate at one side of the drift region; a gate structure formed over portions of the body region, the drift region and the first STI structure most close to the body region; a source region formed in the body region; and a drain region formed in the drift region at one side of the first STI structure most far away from the body region.

14 Claims, 4 Drawing Sheets

(51) Int. Cl.
*H01L 29/78* (2006.01)
*H01L 29/06* (2006.01)
*H01L 21/762* (2006.01)
*H01L 29/08* (2006.01)
*H01L 21/265* (2006.01)
*H01L 29/10* (2006.01)

(52) U.S. Cl.
CPC ...... *H01L 29/0653* (2013.01); *H01L 29/0847* (2013.01); *H01L 29/66659* (2013.01); *H01L 29/7835* (2013.01); *H01L 21/26513* (2013.01); *H01L 21/26586* (2013.01); *H01L 29/1045* (2013.01)

(58) Field of Classification Search
CPC ............. H01L 29/0653; H01L 29/1045; H01L 21/26513; H01L 21/26586
See application file for complete search history.

(56) References Cited

U.S. PATENT DOCUMENTS

| | | | |
|---|---|---|---|
| 2012/0306014 A1* | 12/2012 | Camillo-Castillo | H01L 29/66659 257/343 |
| 2015/0097236 A1* | 4/2015 | Tsai | H01L 29/7816 257/339 |

* cited by examiner ived a divisional of U.S. patent application forming a plurality of first trenches in the semiconductor

LDMOS TRANSISTOR

CROSS REFERENCE TO RELATED APPLICATIONS

This application is a divisional of U.S. patent application Ser. No. 14/808,026, filed on Jul. 24, 2015, which claims the priority of Chinese patent application No. 201410425848.9, filed on Aug. 26, 2014, the entirety of all of which is incorporated herein by reference.

FIELD OF THE INVENTION

The present invention generally relates to the field of semiconductor manufacturing technology and, more particularly, relates to LDMOS transistors and fabrication processes thereof.

BACKGROUND

Power metal oxide semiconductor field-effect transistor (MOSFET) includes Vertical Double-Diffused MOSFET (VDMOSFET), and Lateral Double-Diffused MOSFET (LDMOS MOSFET), etc. Comparing with VDMOSFET, LDMOSFET has a plurality of advantages, such as better thermal stability and frequency stability, higher gain and durability, lower feedback capacitance and thermal resistivity, and constant input impedance and simpler bias circuit, etc.

FIG. 1 illustrates an existing N-type LDMOSFET. As shown in FIG. 1, the LDMOSFET includes a semiconductor substrate (not labeled) and a P-well 100 in the semiconductor substrate; an N-type drift region 101 in the P-well 100; a shallow trench isolation (STI) structure 104 in the N-type drift region 101 configured to increase the conductive path of the LDMOSFET so as to increase the breakdown voltage of the LDMOSFET; a P-type body region 106 in the P-well 100 at one side of the N-type drift region 101; and a gate structure 105 over on the semiconductor substrate. The gate structure 105 is over the P-type body region 106 and the N-type drift region 101; and a portion of the gate structure 105 may be over the STI structure 104. The gate structure 105 includes a gate dielectric layer (not labeled) on the surface of the semiconductor substrate; a gate electrode (not labeled) on the gate dielectric layer; and sidewall spacers (not labeled) on side surfaces of the gate electrode and the gate dielectric layer. Further, the LDMOSFET also includes a source region 102 in the P-type body region 106 at one side of the gate structure 105 and a drain region 103 in the N-type drift region 101 at the other side of the gate structure 105. The source region 102 and the drain region 103 are N-type doped.

However, in order to increase the breakdown voltage of such LDMOSFET, the size of the STI structure 104 needs to be increased to enlarge the conductive path. Thus, the STI structure 104 may consume a relatively large surface area of the substrate; and the production cost may be increased. In addition, the performance of the LDMOSFET may need further improvement. The disclosed device structures and methods are directed to solve one or more problems set forth above and other problems.

BRIEF SUMMARY OF THE DISCLOSURE

One aspect of the present disclosure includes a method for fabricating a LDMOS transistor. The method includes providing a semiconductor substrate with a first doping type; forming a plurality of first trenches in the semiconductor substrate; forming a drift region with a second doping type on surface of the semiconductor substrate exposed by side and bottom surfaces of the plurality of first trenches and surface of the semiconductor substrate between adjacent first trenches to increase an effective conductive path formed in the drift region of the LDMOS transistor in per unit area; forming a plurality of first shallow trench isolation structures by filling isolation material in the plurality of first trenches; forming a body region in the semiconductor substrate at one side of the drift region; forming a gate structure over surfaces of a portion of the body region, the drift region and the first shallow trench structure most close to the body region; forming a source region in the body region at one side of the gate structure; and forming a drain region in the drift region at one side of the first shallow trench isolation structure most far away from the body region.

Another aspect of the present disclosure includes a LDMOS transistor. The LDMOS transistor includes a semiconductor substrate with a first doping type and a surface; a plurality of first trenches formed in the surface of the semiconductor substrate; a drift region with an increased conductive path of the LDMOS transistor and a second doping type formed on the surface of the semiconductor substrate between adjacent first trenches and the semiconductor substrate exposed by side and bottom surfaces of the plurality of first trenches; a first shallow trench isolation structure formed in each of the plurality of the first trenches; a body region with a doping type opposite to the second doping type formed in semiconductor substrate at one side of the drift region; a gate structure formed over portions of the body region, the drift region and the first STI structure most close to the body region; a source region formed in the body region at one side of the gate structure; and a drain region formed in the drift region at one side of the STI structure most far away from the body region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described previously, the performance of the existing LDMOS transistor may need further improvements. For example, by forming the STI structure in the existing LDMOS transistor to increase the conductive path may have certain limitations. That is, the increase of the breakdown voltage of the LDMOS transistor may have certain limitations.

Figure 1:
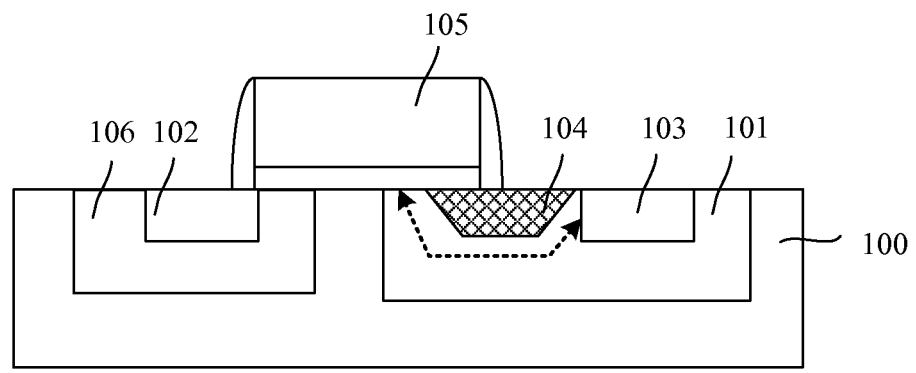
FIG. 1 illustrates an existing LDMOS transistor.

Specifically, increasing the conductive path of the existing LDMOS transistor may mainly be achieved by forming the STI structure in the drift region. That is, the deeper and the wider of the STI structure is, the longer of the corresponding conductive path is. As shown in FIG. 1, the dashed line refers to the conductive path formed in the drift region 101. The conductive path is distributed along the side surface and the bottom surface of the STI structure 104. Thus, the depth and the width of the STI structure 104 may directly affect the length of the conductive path. In order to obtain a longer conductive path, a common approach is to increase the width and the length of the STI structure 104. However, increasing the width of the STI structure 104 will increase the area of each LDMOS transistor on the semiconductor substrate; and it may affect the integration level. Further, increasing the depth of the STI structure 104 may require a thicker semiconductor substrate; and may increase the requirements of the etching process and deposition process for forming the STI structure 104. Thus, the production cost of the LDMOS transistor may be increased. According to the disclosed processes and the devices, the conductive path of the LDMOS transistor may be increased by forming a W-shaped, or wave-shaped drift layer.

Figure 7:
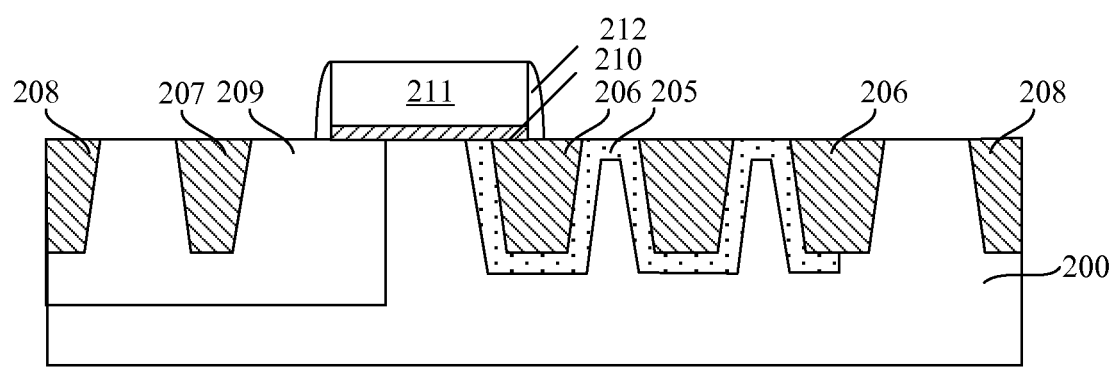
Figure 8:
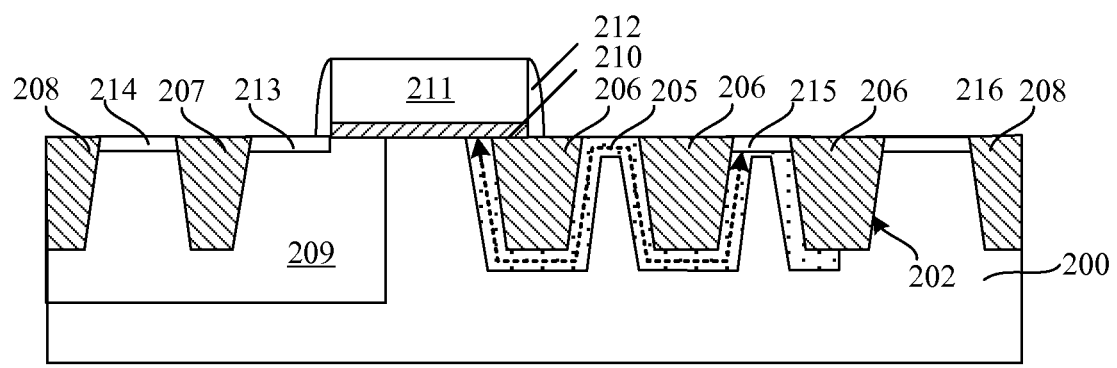
Figure 9:
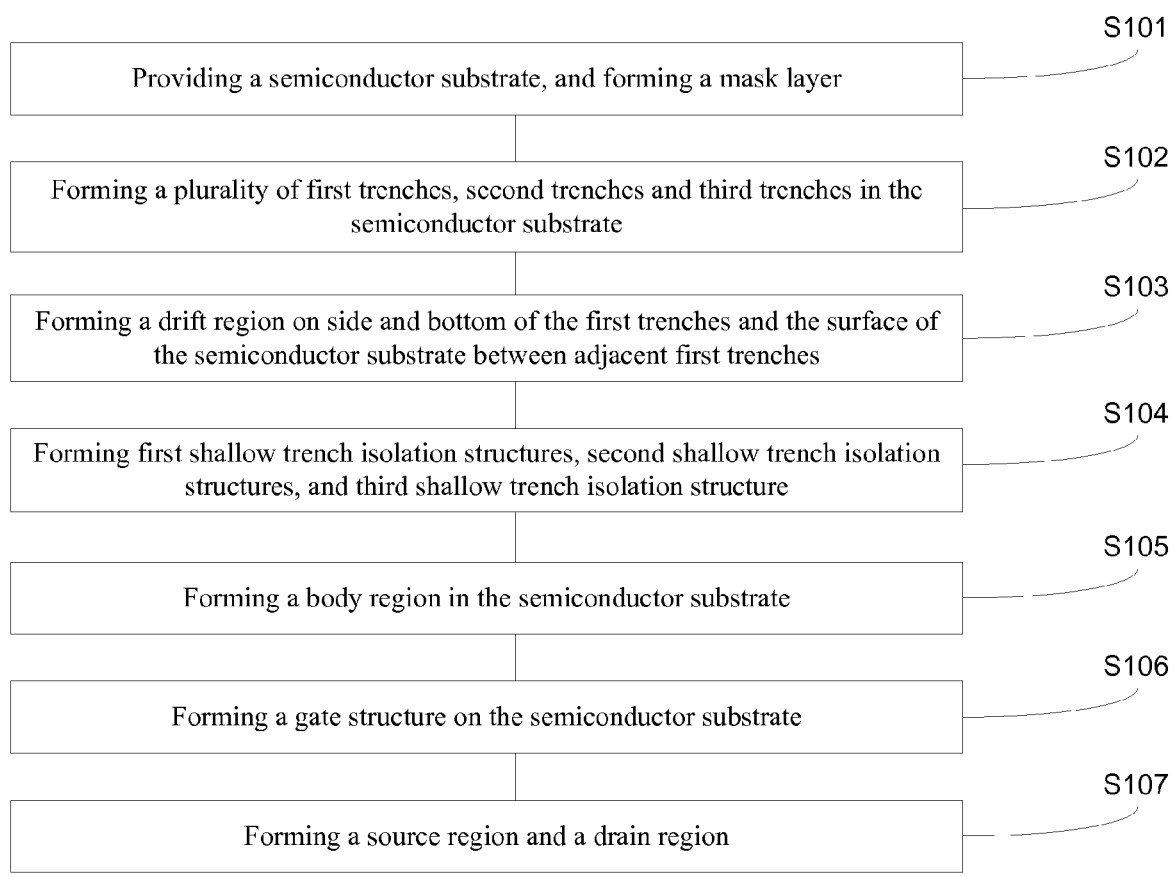
FIG. 9 illustrates an exemplary fabrication process of an LDMOS transistor consistent with the disclosed embodiments.

FIG. 9 illustrates an exemplary fabrication process of an LDMOS transistor consistent with the disclosed embodiments; and FIGS. 2-8 illustrate semiconductor structures corresponding to certain stages of the exemplary fabrication process.

Figure 2:
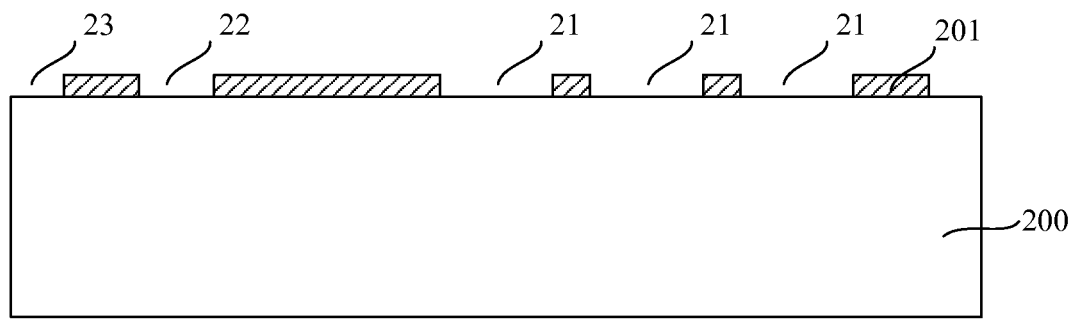
FIGS. 2-8 illustrate semiconductor structures corresponding to certain stages of an exemplary fabrication process of an LDMOS transistor.

As shown in FIG. 9, at the beginning of fabrication process, a semiconductor substrate with certain structures is provided (S101). FIG. 2 illustrates a corresponding semiconductor structure.

As shown in FIG. 2, a semiconductor substrate 200 is provided. The semiconductor substrate 200 may have a first doping type. Further, a mask layer 201 may be formed on the surface of the semiconductor substrate 200. The mask layer 201 may have a plurality of openings exposing the surface of the semiconductor substrate 200. The openings may include a plurality of the first openings 21, a plurality of second openings 22 and a plurality of third openings 23.

The semiconductor substrate 200 may be made of any appropriate semiconductor materials, such as single crystal silicon, polysilicon, silicon on insulator (SOI), silicon germanium, carborundum, indium antimonite, lead telluride, indium arsenide, indium phosphate, gallium arsenide, gallium antimonite, alloy semiconductor or a combination thereof. In one embodiment, the semiconductor substrate 200 is made of silicon. The semiconductor substrate 200 provides a base for subsequent devices and processes.

The semiconductor substrate 200 may be doped with a certain type of ions such that the semiconductor substrate 200 may have a first doping type. Various processes may be used to dope the semiconductor substrate 200, such as a thermal diffusion process, or an ion implantation process, etc. In one embodiment, the semiconductor substrate 200 is doped by an ion implantation process.

The doping type of the semiconductor substrate 200 may be selected according to the type of the subsequently formed LDMOS transistor. Specifically, if the LDMOS transistor is N-type LDMOS transistor, P-type ions may be doped into the semiconductor substrate 200. The P-type ions may include one or more of boron ions, indium ions, and gallium ions, etc. That is, the first doping type is P-type. If the LDMOS transistor is P-type LDMOS transistor, N-type ions may be doped into the semiconductor substrate 200. The N-type ions may include one or more of phosphorous ions, arsenic ions and antimony ions, etc. That is, the first doping type is N-type.

In one embodiment, the LDMOS transistor is an N-type LDMOS transistor. The semiconductor substrate 200 is P-type doped.

The mask layer 201 may be used as a mask for subsequently etching the semiconductor substrate 200 to form first trenches. The mask layer 201 may be a single layer structure or a multiple-layer structure, i.e., the layer number is equal to, or greater than two.

In one embodiment, the mask layer 201 is a double-layer structure including a first sub-mask layer formed on the semiconductor substrate 200, and a second sub-mask layer formed on the first mask layer. The first sub-mask layer and the second sub-mask layer may be made of different materials. In one embodiment, the first sub-mask layer may be made of silicon oxide, etc.; and the second sub-mask layer may be made of silicon nitride. In certain other embodiments, the first sub-mask layer and the second sub-mask layer may be made of other appropriate material.

The number of the first openings 21 may be equal to, or greater than 2. The plurality of first openings 21 may be adjacent. The number of the first openings 21 may be identical to the number of the subsequently formed first trenches.

Figure 3:
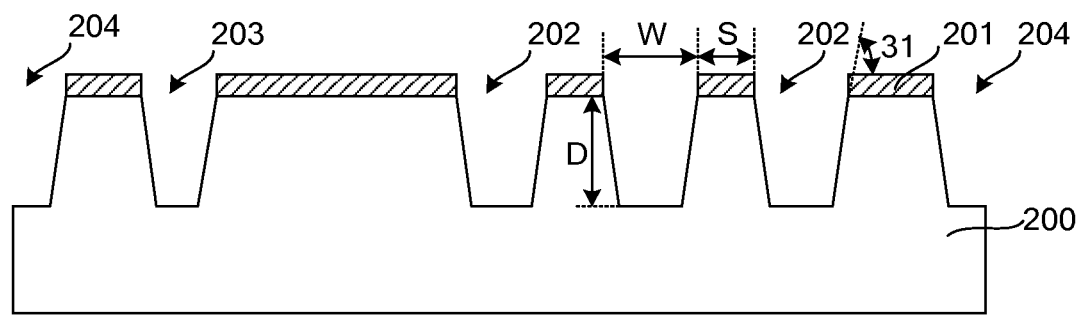

Returning to FIG. 9, after providing the semiconductor substrate 200 and forming the mask layer 201, a plurality of first trenches, second trenches and third trenches may be formed (S102). FIG. 3 illustrates a corresponding semiconductor structure.

As shown in FIG. 3, a plurality of first trenches 202, a second trench 203 and a third trench 204 are formed in the semiconductor substrate 200. In certain other embodiments, the second trenches 203 and the third trench 204 may also be more than two. The plurality of first trenches 202, the second trench 203 and the third trench 204 may be formed by etching the semiconductor substrate 200 using the mask layer 201 as an etching mask along the first openings 21, the second opening 22 and the third opening 23.

The side surfaces of the first trenches 202 may be inclining side surfaces, i.e., not perpendicular to the surface of the semiconductor substrate 200, having an inclining angle 31. Such a shape may reduce the process difficulties for subsequently forming a drift region by implanting ions into the side surfaces of the first trenches 202.

If the inclining angle 31 of the side surfaces of the first trenches 202 is substantially small, in order to ensure the insulation properties of the subsequently formed STI structure, the depth and the width of the first trenches 202 may need to be increased. Thus, it may limit the increase of the integration level. If the inclining angle 31 is significantly large, because the depth of the first trenches 202 may be relatively large, and the width may be relatively small, it may be difficult to subsequently dope the portions of the semiconductor substrate 200 on the bottom of the first trenches 202 uniformly by an ion plantation process. Thus, in one embodiment, the inclining angle 31 of the side surfaces of the first trenches 202 may be in range of approximately 50°~80°. For example, it may be approximately 50°, 60°, 70°, or 80°, etc.

The semiconductor substrate 200 may be etched by any appropriate process, such as a dry etching process, a wet etching process, or an ion beam etching process, etc. In one embodiment, a plasma dry etching process is used to etch the semiconductor substrate 200 to form the first trenches 202, the second trench 203 and the third trench 204. The etching gas of the plasma etching process may include $Cl_2$, HBr, and $O_2$, etc. The pressure of the reaction chamber may be in a range of approximately 1 mTorr~150 mTorr. The power of the radio frequency plasma may be in a range of approximately 100 W~500 W. The flow rate of HBr may be in range of approximately 100 sccm~1000 sccm. The flow rate of $Cl_2$ may be in a range of approximately 10 sccm~500 sccm. The flow rate of $O_2$ may be in a range of approximately 10 sccm~300 sccm.

The plurality of first trenches 202 may be configured as the windows for subsequently forming a drift region by an ion implantation process. The drift region may be distributed in surface of the semiconductor substrate 200 exposed by the side and bottom surfaces of the adjacent first trenches 202 and the surface of the semiconductor substrate 200 between adjacent first trenches 202. Thus, comparing with the LDMOS transistor illustrated in FIG. 1, the effective length of the drift region in per unit area may be increased; and the effective conductive path of the subsequently formed LDMOS transistor may be increased.

The number of the first trenches 202 may be equal to or greater than two. The depth "D" of the first trenches 202 may be in a range of approximately 2500 Å~4500 Å. The width "W" of the first trenches 202 may be in a range of approximately 0.5 μm~10 μm. The distance "S" between adjacent first trenches 202 may be in a range of approximately 0.2 μm~1 μm. Such parameters may cause the drift region subsequently formed on the portions of semiconductor substrate 200 exposed by the side surfaces and bottom surfaces of the first trenches 202 and the portions of the surface of the semiconductor substrate 200 between adjacent first trenches 202 to have a relatively long effective length; and the first trenches 202 to occupy a relatively small area of the semiconductor substrate 200.

Referring to FIG. 3, for illustrative purposes, three first trenches 202, one second trench 203 and one third trench 204 are described. In certain other embodiments, the number of the first trenches 202 may be two, four, five, or six, etc.

Figure 4:
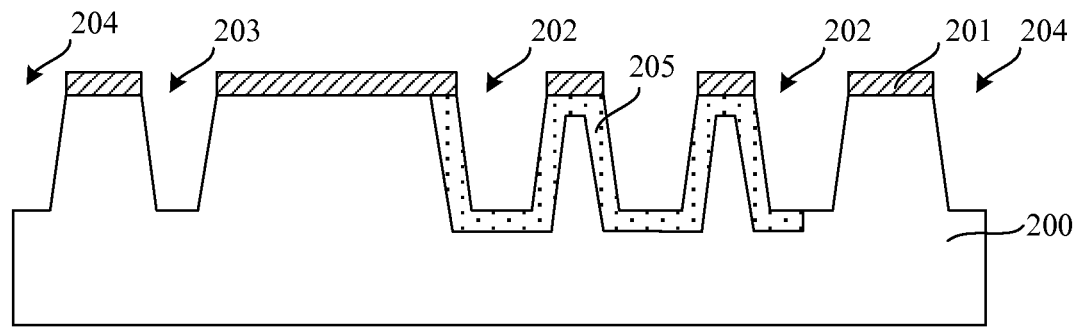

Returning to FIG. 9, after forming the first trenches 202, the second trench 203 and the third trench 204, a drift region may be formed (S103). FIG. 4 illustrates a corresponding semiconductor structure.

As shown in FIG. 4, a drift region 205 is formed on the portions of the surface semiconductor substrate 200 exposed by the side surfaces and bottom surfaces of the first trenches 202 and the portions of the semiconductor substrate 200 between adjacent first trenches 202. The drift region 205 may have a second doping type; and the second doping type may be opposite to the first doping type.

In one embodiment, the LDMOS transistor is an N-type LDMOS transistor. Thus, the first doping type is P-type. Therefore, the second doping type is N-type. That is, the drift region 205 may be doped with N-type doping ions. The N-type doping ions may include one or more of phosphorous ions, arsenic ions and antimony ions, etc.

In certain other embodiments, the LDMOS transistor is a P-type LDMOS transistor. Thus, the first doping type is N-type. Therefore, the second doping type is P-type. That is, the drift region 205 may be doped with P-type doping ions. The P-type doping ions may include one or more of boron ions, indium ions and gallium ions, etc.

Various processes may be used to form the drift region 205, such as an ion implantation process, or a thermal diffusion process, etc. In one embodiment, a first ion implantation process is used to form the drift region 205. Before performing the first ion implantation process, a protective layer (not shown) may be formed on the mask layer 201 and portions of the semiconductor substrate 200 outside of the first trenches 202. The protective layer may avoid implanting ions into the portions of the semiconductor substrate 200 outside of the first trenches 202 during the ion implantation process.

In one embodiment, the protective layer is a photoresist layer; and may be formed by a spin-coating process. After forming the photoresist layer on the semiconductor substrate 200 by a spin-coating process, openings may be formed in the photoresist layer to expose the first trenches 202 and portions of the mask layer 201 on the surface of the semiconductor substrate 200 between adjacent first trenches 202.

The thickness of the drift region 205 may be substantially smaller than the depth of the first trenches 202. In one embodiment, when the first ion implantation process is performed, because the portions of the surface of the semiconductor substrate 200 between adjacent first trenches 202 may be covered by the mask layer 201, the thickness of the portions of the drift region 205 under the mask layer 201 may be smaller than the thickness of the portions of the drift region 205 on the side and bottom surfaces of the first trenches 202.

In one embodiment, the thickness of the portions of the drift region 205 on the portions of the semiconductor substrate 200 between adjacent first trenches 202 and on the portions of the semiconductor substrate 200 exposed by the side surfaces of the first trenches 202 may be in a range of approximately 200 Å~1000 Å. The thickness of the portions of the drift region 205 on the portions of the semiconductor substrate 200 exposed by the bottom surfaces of the first trenches 202 may be in a range of approximately 400 Å~2 μm. In certain other embodiments, the thickness of the drift region 205 may be other appropriate value.

The dose of the first ion implantation process may be in a range of approximately 1E2 $atom/cm^2$~5E2 $atom/cm^2$. The angle of the ion implantation process may be in a range of 0~45°. Such parameters may ensure the doping ions doped into the semiconductor substrate 200 exposed by the side and bottom surfaces of the first trenches 202 and the portions of the semiconductor substrate 200 between adjacent first trenches 202 to have a uniform distribution.

In one embodiment, the drift region 205 is an N-type drift region. The doping ions may be arsenic ions or phosphorous ions. The angle of the arsenic ion implantation process may be in a range of approximately 15°~45°; and the dose may be in a range of approximately 1E2 $atom/cm^2$~5E3 $atom/cm^2$. The angle of the phosphorous ion implantation process may be in a range of approximately 0~7°; and the dose may be in a range of approximately 1E2 $atom/cm^2$~5E3 $atom/cm^2$. By adjusting the type of the doping ions, the angle of the ion implantation process and the dose, after a subsequent thermal annealing process, the doping ions may be uniformly distributed in the drifting region 205.

In certain other embodiments, because the portions of the semiconductor substrate 200 exposed by the side and bottom surfaces of the first trenches 202 may also be doped by certain ions, in order to obtain a uniform distribution of the doping ions, the first ions implantation process may include a first step ion implantation process and a second step ion implantation process. The angle of the first step ion implantation process may be in a range of approximately 0°~45°. The angle of the second step ion implantation process may be approximately 0°.

After the first ion implantation process, a thermal annealing process may be performed. The temperature of the thermal annealing process may be in a range of approximately 1000° C.~1250° C. The time of the thermal annealing process may be in a range of approximately 1 hour~2 hours. Such annealing parameters may activate the doping ions, and cause the doping ions to be uniformly distributed in the drift region 205. In certain other embodiments, the thermal annealing process may be performed after subsequently forming an insulation material layer.

According to the number and shape of the first trenches 202, in one embodiment, the first trenches 202 may be distributed in the semiconductor substrate 200 with a "W" shape or a wave shape. Thus, the drift region 205 may also be "W"-shaped, or wave-shaped. Correspondingly, the effective length of the drift region 205 in per unit area may be increased. Therefore, the conductive path formed in the drift region 205 may be increased; and the breakdown voltage of the LDMOS transistor may be increased.

Figure 5:
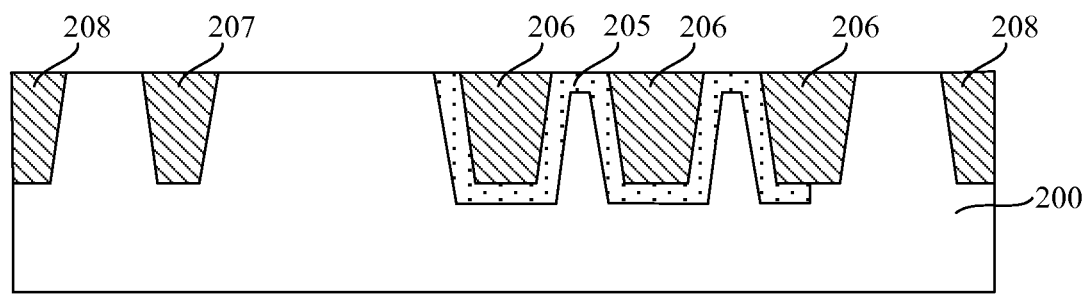

Returning to FIG. 9, after forming the drift region 205, a plurality of first shallow trench isolation (STI) structures, a second STI structure and a third STI structure may be formed (S104). FIG. 5 illustrates a corresponding semiconductor structure.

As shown in FIG. 5, a plurality of first STI structures 206 are formed. That is, a STI structure 206 is formed in each of the plurality of the first trenches 202. The first STI structures 206 may cover portions of the drift region 205. Further, a second STI structure 207 is formed in the second trench 203; and a third STI structure 208 is formed in the third trench 204.

Specifically, after forming the drift region 205, isolation material may be filled in the first trenches 202; and the plurality of first STI structure 206 may be formed. At the same time, the isolation material may also be filled in the second trench 203 and the third trench 204. Thus, the second STI structure 207 and the third STI structure 208 may be formed.

A process for forming the first STI structures 206, the second STI structure 207 and the third STI structure 208 may include forming the isolation material to cover the mask layer 201 and the semiconductor substrate 200, and to fill the first trenches 202, the second trench 203 and the third trench 204; and followed by removing the isolation material on the semiconductor substrate 200 and removing the mask layer 201 by a planarization process.

The second STI structure 207 may be used to electrically isolate a subsequently formed second doping region and a subsequently source region. The third STI structure 208 may be used to electrically isolate the adjacent active regions.

The isolation material may be made of silicon oxide, silicon nitride, or silicon oxynitride, etc. In one embodiment, the isolation material is made of silicon oxide.

The isolation material may be formed by any appropriate process, such as a CVD process, including a low-pressure CVD (LPCVD) process, an atmosphere CVD (APCVD) process, a sub-atmosphere CVD (SACVD process, a plasma-enhanced CVD (PECVD) process, and a high-density-plasma CVD (HDPCVD) process, etc. The isolation material may also be formed by other appropriate process, such as a PVD process, an ALD process, or a FCVD process, etc.

The isolation material on semiconductor substrate 200 and the mask layer 201 may be removed by any appropriate process, such as a chemical mechanical polishing process, a physical mechanical polishing process, or an ion beam polishing process, etc. In one embodiment, a chemical mechanical polishing process is used to remove the isolation material on the semiconductor substrate 200; and to remove the mask layer 201.

Figure 6:
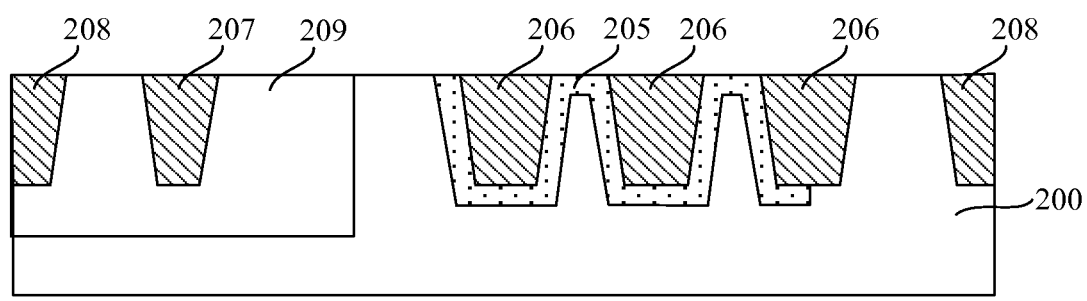

Returning to FIG. 9, after forming the first STI structures 206, the second STI structure 207 and the third STI structure 208, a body region may be formed (S105). FIG. 6 illustrates a corresponding semiconductor structure.

As shown in FIG. 6, a body region 209 is formed in the semiconductor substrate 200 at one side of the drift region 205. The doping type of the body region 209 may be opposite to the doping type of the drift region 205.

The body region 209 may be formed by any appropriate process, such as an ion implantation process, or a thermal diffusion process, etc. In one embodiment, a second ion implantation process is used to form the body region 209. In one embodiment, the LDMOS transistor is an N-type LDMOS transistor. Thus, the body region 209 is P-type doped. In certain other embodiments, the LDMOS transistor is a P-type LDMOS transistor. Thus, the body region 209 is N-type doped.

The body region 209 may surround the second STI structure 207. Further, the depth of the body region 209 may be greater than the depth of the second STI structure 207.

Returning to FIG. 9, after forming the body region 209, a gate structure may be formed (S106). FIG. 7 illustrates a corresponding semiconductor structure.

A shown in FIG. 7, a gate structure (not labeled) is formed on the semiconductor substrate 200. The gate structure may include a gate dielectric layer 210 formed on the semiconductor substrate 200, a gate electrode layer 211 formed on the gate dielectric layer 210; and sidewall spacers 212 formed on the semiconductor substrate 200 around the side surfaces of the gate dielectric layer 210 and the gate electrode layer 211. The gate structure may be over portions of the body region 209, the drift region 205 and one of the first STI structures 206 most close to the body region 209.

The gate structure may be any appropriate structure. In one embodiment, the gate structure is a polysilicon gate structure. The gate dielectric layer 210 may be made of silicon oxide, etc. The gate electrode layer may be made of polysilicon.

In one embodiment, a process for forming the gate structure may include forming a gate dielectric material layer to cover the surfaces of the semiconductor substrate 200, the first STI structures 206 and the drift region 205; forming a gate electrode material layer on the gate dielectric layer; and etching the gate electrode material layer and the gate dielectric material layer to form the gate dielectric layer 210 over portions of the body region 209, the drift region 205 and one of the first STI structures 205 most close to the body region 209, and the gate electrode layer 211 on the gate dielectric layer 210; forming a sidewall spacer material layer to cover the surfaces of the semiconductor substrate 200, the gate electrode layer 211 and the gate dielectric layer 210; and etching the sidewall material layer by a mask-less etching process to form the sidewall spacers 212 on the side surfaces of the gate dielectric layer 210 and the gate electrode layer 211. The sidewall spacers 212 may a single-layer structure or a multiple-layer structure.

In certain other embodiments, the gate structure may be a metal gate structure. The gate dielectric layer 210 may be made of high dielectric constant (High-K) material, such as $HfO_2$, $TiO_2$, HfZrO, or HfSiNO, etc. The gate electrode layer 211 may be metal, such as W, Cu, or Al, etc. The metal gate structure may be formed by a gate-last process.

Before forming the sidewall spacers 212, a lightly doping process may be performed on the body region 209 and the drift region 205 at both sides of the gate electrode layer 211. Thus, lightly-doped drain (LDD) regions may be formed in the body region 209 and the drift region 205 at both sides of the gate structure.

Returning to FIG. 9, after forming the gate structure, a source region and a drain region may be formed (S107). FIG. 8 illustrates a corresponding semiconductor structure.

As shown in FIG. 8, a source region 213 is formed in the body region 209 at one side of the gate structure; a drain region 215 is formed in the drift region 205 at one side of the first STI structure 206 most far away from the body region 209. The doping type of the source region 213 may be identical to the doping type of the drain region 215.

The source region 213 and the drain region 215 may be formed by any appropriate process. In one embodiment, an ion implantation process is used to form the source region 213 and the drain region 215.

In one embodiment, the LDMOS transistor is an N-type LDMOS transistor. Thus, the source region 213 and the drain region 215 are N-type doped. In certain other embodiments, the LDMOS transistor is a P-type LDMOS transistor. Thus, the source region 213 and the drain region 215 are P-type doped.

The drain region 215 may be in the drift region 205. Further, the drain region 215 may be in the drift region 205 at one side of the first STI structure 206 most far away from the body region 209. Thus, the conductive path between the source region 213 and the drain region 215 formed in the drift region 205, as shown in FIG. 8 with the dashed-line, may be maximized.

Further, the depth of the drain region 215 may be smaller than the depth of the portions of the drift region 205 on the surface of the semiconductor substrate 200 between adjacent first STI structures 206. The source region 213 may be formed in the body region 209 between the second STI structure 207 and the gate structure. The depth of the source region 213 may be smaller than the depth of the second STI structure 207.

Further, referring to FIG. 8, a second doping region 214 may be formed in the body region 209 at the side of the second STI structure 207 far away from the source region 213 (far away from the gate structure). The doping type of the second doping region 214 may be identical to the doping type of the body region 209. The second doping region 214 may be used to apply a voltage on the body region 209, or ground body region 209.

Further, a first doping region 216 may be formed in the semiconductor substrate 200 at the other side of the first STI structure 206 most far away from the body region 209 (far away from the gate structure). The doping type of the first doping region 216 may be identical to the doping type of the semiconductor substrate 200. The first doping region 216 may be used to apply a voltage to the semiconductor substrate 200, or ground the semiconductor substrate 200.

Thus, an LDMOS transistor may be formed by the above disclosed processes and methods; and the corresponding semiconductor structure is illustrated in FIG. 8. As shown in FIG. 8, the LDMOS transistor includes a semiconductor substrate 200 with a first doping type. The LDMOS transistor also includes a gate structure having a gate dielectric layer 210 formed on the surface of the semiconductor substrate 200, a gate electrode layer 211 formed on the gate dielectric layer 210, and sidewall spacers 212 formed on the surface of the semiconductor substrate around the side surfaces of the gate dielectric layer 210 and the gate electrode layer 211.

Further, the LDMOS transistor includes a body region 209 formed in the semiconductor substrate 200 at one side of the gate structure, and a drift region 205 with a wave shape, or a "W" shape and a second doping type formed in the semiconductor substrate 200 at the other side of the gate structure. The drift region 205 and the body region 209 have opposite doping types. Further, the LDMOS transistor also includes a plurality of first STI structures 206 formed in the semiconductor substrate 200 at a same side of the gate structure with the drift region 205. Further, the LDMOS transistor also includes a second STI structure 207 and a third STI structure 208 formed in the body region 209.

Further, the LDMOS transistor also includes a source region 213 formed in the body region 209 at one side of the gate structure, and a drain region 215 formed in the drift region 205 at one side of the first STI structure 206 most far away from the body region 209. Further, the LDMOS transistor also includes a first doping region 216 formed in the semiconductor substrate 200 at the other side of the first STI structure 206 most far away from the body region 209; and a second doping region 214 formed in the body region 209 at one side of the second STI structure 207 most far away from the source region 213. The detailed structures and intermediate structures are described above with respect to the fabrication processes.

Therefore, according to the disclosed methods and structures, a plurality of first trenches may be formed in the semiconductor substrate; and a drift region may be formed on the surface of the semiconductor substrate exposed by the side and bottom surfaces of the plurality of first trenches and the surface of the semiconductor substrate between adjacent first trenches. That is, the drift region may be "W"-shaped, or Wave-shaped. Thus, comparing with the straight drift region, the effective length of the "W"-shaped, or Wave-shaped drift region in per unit area may be increased. When the LDMOS transistor is in operation, the conductive path formed in the drift region may be increased. The breakdown voltage of the LDMOS transistor may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:
1. An LDMOS transistor, comprising:
 a semiconductor substrate with a first doping type and a surface;
 a plurality of first trenches formed in the surface of the semiconductor substrate;
 a drift region with an increased conductive path of the LDMOS transistor in per unit area and a second doping type formed on the surface of the semiconductor substrate between adjacent first trenches and the semiconductor substrate exposed by side and bottom surfaces of the plurality of first trenches;
 a first shallow trench isolation (STI) structure formed in each of the plurality of the first trenches;
 a body region with a doping type opposite to the second doping type formed in semiconductor substrate at one side of the drift region;
 a gate structure formed over portions of the body region, the drift region and the first STI structure most close to the body region;
 a source region formed in the body region at one side of the gate structure; and a drain region formed in the drift region at one side of the first shallow trench isolation structure most far away from the body region.

2. The LDMOS transistor according to claim 1, wherein: the drift region is W-shaped or wave-shaped.

3. The LDMOS transistor according to claim 1, wherein:
a thickness of the drift region on the surface of the semiconductor substrate between adjacent first trenches and the semiconductor substrate exposed by the side surfaces of the first trenches is in a range of approximately 200 Å~1000 Å; and
a thickness of the drift region on the semiconductor substrate exposed by the bottom surfaces of the first trenches is in a range of approximately 400 Å~2 μm.

4. The LDMOS transistor according to claim 1, wherein:
side surfaces of the first trenches are inclining side surfaces; and
an inclining angle of the side surfaces of the first trenches is in a range of approximately 50°~80°.

5. The LDMOS transistor according to claim 1, wherein:
a number of the plurality of first trenches is equal to, or greater than two;
a depth of the first trenches is in a range of approximately 2500 Å~4500 Å;
a width of the first trenches is in a range of approximately 0.5 μm~10 μm; and
a distance between adjacent first trenches is in a range of approximately 0.2 μm~1 μm.

6. The LDMOS transistor according to claim 1, wherein:
the first doping type is N-type; and
the second doping type is P-type.

7. The semiconductor structure according to claim 1, wherein:
the first doping type is P-type; and
the second doping type is N-type.

8. The semiconductor structure according to claim 1, wherein:
more than one of the plurality of first STI structures are located between the drain region and the gate structure.

9. The semiconductor structure according to claim 1, wherein:
a doping type of the drift region is opposite to the first doping type.

10. The semiconductor structure according to claim 1, further including:
a first doping region with the first doping type in the semiconductor substrate at a same side of the gate structure as the drift region.

11. The semiconductor structure according to claim 1, further including:
a second STI structure with a depth smaller than a depth of the body region in the body region at one side of the source region; and
a second doping region with a doping type same as a doping type of the body region in the body region at one side of the second STI structure.

12. The semiconductor structure according to claim 1, wherein:
the first STI structures and the second STI structure are made of silicon oxide.

13. The semiconductor structure according to claim 1, wherein:
at least one of the plurality of first STI structures is located partially under the gate structure.

14. The semiconductor structure according to claim 1, wherein:
a portion of the drift region is located under the drain region.

* * * * *